(12) United States Patent
Ewanchuk et al.

(10) Patent No.: US 11,388,845 B2
(45) Date of Patent: Jul. 12, 2022

(54) MULTI-DIE TEMPERATURE CONTROL DEVICE AND METHOD FOR CONTROLLING TEMPERATURE OF MULTI-DIE POWER MODULE

(71) Applicant: MITSUBISHI ELECTRIC CORPORATION, Tokyo (JP)

(72) Inventors: Jeffrey Ewanchuk, Rennes (FR); Julio Brandelero, Rennes (FR)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 344 days.

(21) Appl. No.: 16/485,995

(22) PCT Filed: Mar. 1, 2018

(86) PCT No.: PCT/JP2018/008879
§ 371 (c)(1),
(2) Date: Aug. 14, 2019

(87) PCT Pub. No.: WO2018/180324
PCT Pub. Date: Oct. 4, 2018

(65) Prior Publication Data
US 2020/0236823 A1    Jul. 23, 2020

(30) Foreign Application Priority Data

Mar. 31, 2017 (EP) .................................. 17164063

(51) Int. Cl.
*G01K 3/00* (2006.01)
*H05K 7/20* (2006.01)
(Continued)

(52) U.S. Cl.
CPC .......... *H05K 7/20945* (2013.01); *G01K 3/04* (2013.01); *G01K 3/06* (2013.01); *H01L 23/34* (2013.01); *G01K 2217/00* (2013.01)

(58) Field of Classification Search
CPC combination set(s) only.
See application file for complete search history.

(56) References Cited

U.S. PATENT DOCUMENTS 6,288,597 B1 * 9/2001 Hasegawa .......... H03K 17/0828
327/403
2012/0313595 A1 * 12/2012 Mao ..................... H01L 21/4842
323/271
(Continued)

FOREIGN PATENT DOCUMENTS

EP    3 026 801 A1    6/2016
EP    3208586 A1 *   8/2017    ........... H03K 17/122
(Continued)

OTHER PUBLICATIONS

Japanese Office Action for Japanese Application No. 2019-534425, dated Aug. 18, 2020, with English translation.

*Primary Examiner* — Lisa M Caputo
*Assistant Examiner* — Nasir U. Ahmed
(74) *Attorney, Agent, or Firm* — Birch, Stewart, Kolasch & Birch, LLP (57) ABSTRACT

The present invention concerns a method for controlling the temperature of a multi-die power module, a multi-die temperature control device. The multi-die temperature control: obtains a signal that is representative of the temperature of one die among the dies of the multi-die power module when the die is not conducting, obtains signals that are representative of a reference temperature that is dependent of the temperature of all the dies of the multi-die power module when the dies are not conducting, compares the signal that is representative of the temperature of one die to the signal that is representative of the reference temperature, reduces the duration of the conducting time of the die or reducing the
(Continued)

duration of the conducting time of the other dies of the multi-die power module according to the comparison result.

4 Claims, 5 Drawing Sheets

(51) Int. Cl.
*G01K 3/04* (2006.01)
*G01K 3/06* (2006.01)
*H01L 23/34* (2006.01)

(56) References Cited

U.S. PATENT DOCUMENTS

2017/0324318 A1* 11/2017 Ewanchuk ........... H03K 17/145
2018/0372553 A1* 12/2018 Ewanchuk ............. G01K 13/00

FOREIGN PATENT DOCUMENTS

JP        2000-124781 A    4/2000
WO   WO 2016/084324 A1   6/2016

* cited by examiner

MULTI-DIE TEMPERATURE CONTROL DEVICE AND METHOD FOR CONTROLLING TEMPERATURE OF MULTI-DIE POWER MODULE

TECHNICAL FIELD

The present invention relates generally to a device and a method for controlling the temperature of a multi-die power module.

BACKGROUND ART

Due to limitations in semiconductor manufacturing processes, there is a practical limit in the total semiconductor area for a single power die. Hence, a high power module typically contains several dies in parallel to achieve a given current rating.

However, due to non-ideal constraints on geometry and electrical parameter variations, the temperature distribution within the set of parallel dies is typically non-uniform. As a consequence, the hottest die limits the total amount of power the module can dissipate and the non-uniform temperature distribution causes unequal aging of each die, limiting the effectiveness of using parallel devices.

The present invention aims to allow a temperature control of a multi-die power module that is reliable using a closed-loop temperature control in order to increase the lifespan of the multi-die power module by reducing local hot spot temperatures.

SUMMARY OF INVENTION

To that end, the present invention concerns a method for controlling the temperature of a multi-die power module comprising plural dies, a multi-die temperature control device receiving an input signal and driving independently the dies of the multi-die power module, characterized in that the method is executed by the multi-die temperature control device and comprises the steps of:
  obtaining a signal that is representative of the temperature of one die among the dies of the multi-die power module when the die is not conducting,
  obtaining signals that are representative of a reference temperature that is dependent of the temperature of all the dies of the multi-die power module when the dies are not conducting,
  comparing the signal that is representative of the temperature of one die to the signal that is representative of the reference temperature,
  reducing the duration of the conducting time of the die or reducing the duration of the conducting time of the other dies of the multi-die power module according to the comparison result.

The present invention concerns also a multi-die temperature control device that controls the temperature of a multi-die power module comprising plural dies, the multi-die temperature control device receiving an input signal and driving independently the dies of the multi-die power module, characterized in that the multi-die temperature control device comprises:
  means for obtaining a signal that is representative of the temperature of one die among the dies of the multi-die power module when the die is not conducting,
  means for obtaining signals that are representative of a reference temperature that is dependent of the temperature of all the dies of the multi-die power module when the dies are not conducting,
  means for comparing the signal that is representative of the temperature of one die to the signal that is representative of the reference temperature,
  means for reducing the duration of the conducting time of the die or reducing the duration of the conducting time of the other dies of the multi-die power module according to the comparison result.

Thus, the multi-die temperature control device is able to balance the temperatures across the set of parallel dies independently of the loading condition and without any additional sensors.

According to a particular feature, the input signal is a pulse width modulated signal composed of consecutive periodic cycles of time and the signal that is representative of the temperature of one die among the dies of the multi-die power module and the signal that is representative of the reference temperature are obtained within the same cycle of time.

Thus, the multi-die temperature control device is able to compare the temperature of one die to the most recent reference temperature. The multi-die temperature control device operation can be updated independently of the number of dies in the system and load condition.

According to a particular feature, the signal that is representative of the temperature of one die and the signal that is representative of the reference temperature are obtained by providing a current to the gate of the die and to the gates of the dies.

Thus, only one circuit is necessary to acquire the temperature of one die and the reference temperature. A low cost and simple method for sensing the temperature can be easily integrated into gate drivers for power devices.

According to a particular feature, the signal that is representative of the reference temperature is representative of an equivalent resistor value of the internal gate resistor values of the dies put in parallel.

Thus, the reference temperature is a value close to the mean temperature of the power devices put in parallel. The reference temperature can be deduced without any further complex calculations.

The characteristics of the invention will emerge more clearly from a reading of the following description of example embodiments, the said description being produced with reference to the accompanying drawings.

DESCRIPTION OF EMBODIMENTS

Figure 1:
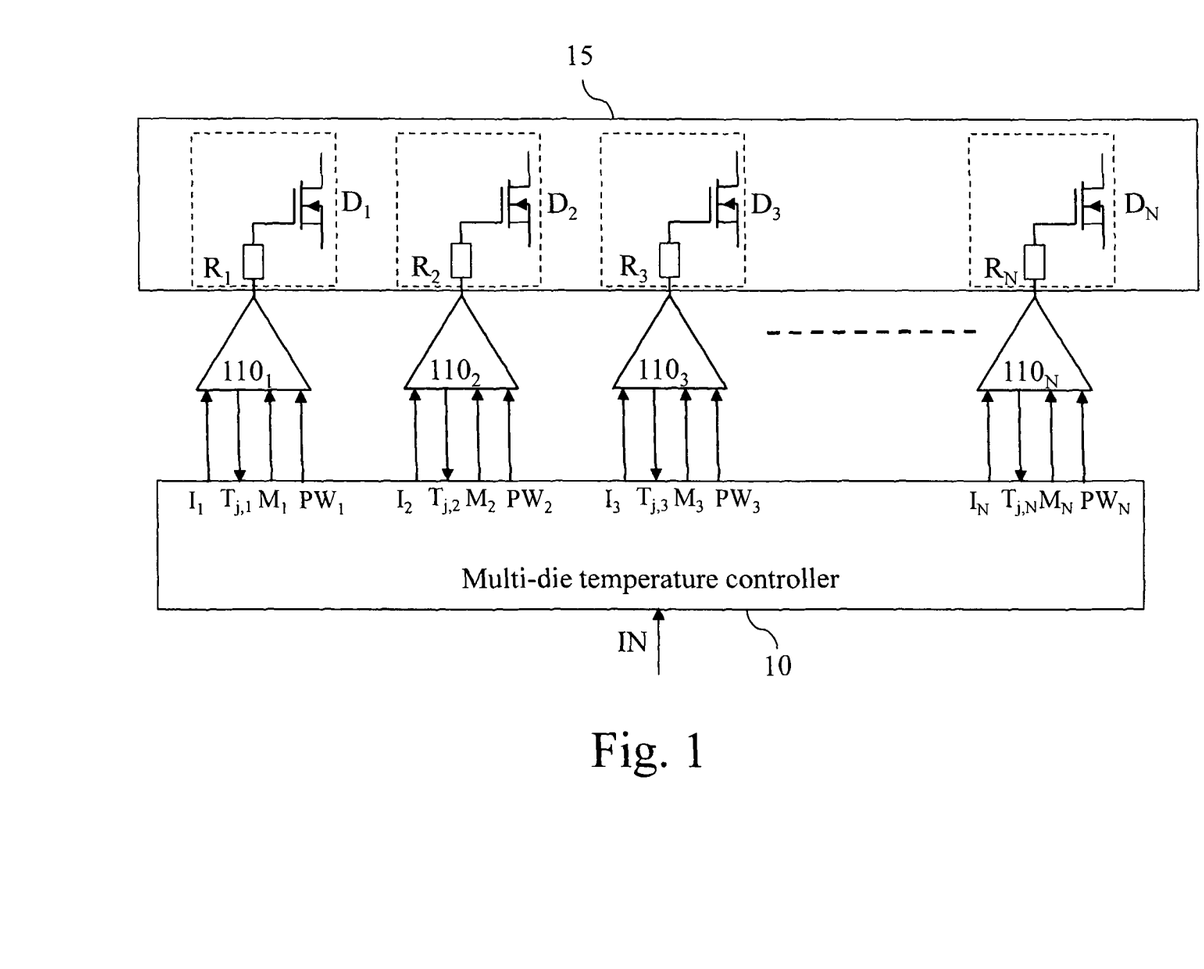
FIG. 1 represents an example of a multi-die power module that is controlled by a multi-die temperature control device according to the present invention.

FIG. 1 represents an example of a multi-die power module that is controlled by a multi-die temperature control device according to the present invention.

The multi-die power module 15 comprises N dies noted $D_1$ to $D_N$. Each resistor $R_1$ to $R_N$ is representative of an equivalent internal gate resistor of dies $D_1$ to $D_N$.

The multi-die temperature control device 10 receives an input signal IN and drives independently the dies $D_1$ to $D_N$ through respective amplifiers $110_1$ to $110_N$. The amplifiers $110_1$ to $110_N$ further comprise die temperature sensing means.

The multi-die temperature control device 10 uses a closed-loop temperature control that can be either relative or absolute temperature from the dies $D_1$ to $D_N$ in order to increase the lifespan of the multi-die power module 15 by reducing local hot spot temperatures.

According to the present invention, a reference temperature and an individual die temperature are determined in a single pulse width modulation cycle. The reference temperature and the individual die temperature are used for controlling the temperature of the dies $D_1$ to $D_N$ of the multi-die power module 15.

The resistors $R_1$ to $R_N$ are respectively the internal gates of the dies $D_1$ to $D_N$.

The temperatures are derived according to an internal gate resistance measurement technique, which depends on using the internal gate resistance of the dies within the power module as a temperature sensitive parameter.

According to the present invention, the reference temperature is derived from an equivalent resistor value of the internal gate resistor values of the dies put in parallel and may be considered as an approximate average temperature of the dies $D_1$ to $D_N$.

The internal gate resistance R of a die can be approximated as $R=a*t+b$ where a and b are contants, according to a calibrated table of values relating the temperature to the resistance, b>>a and t is the temperature of the die. For example, $a=0.003\Omega/°$ C. and $b=13\Omega$, for a modern IGBT power device.

The reference temperature is determined as the mean of the voltages $T_{j,1}$ to $T_{j,N}$ measured using a current $I_1$ to $I_N$ passing through the internal gate resistor of the dies $D_1$ to $D_N$ when all the dies $D_1$ to $D_N$ are not conducting, i.e. the measurement is performed by measuring the equivalent resistor value of the internal gate resistors put in parallel.

The reference temperature is determined when all the dies $D_1$ to $D_N$ are not conducting, i.e. in a OFF state.

Since practical power electronic converters feature periods of inactivity during the commutation cycle, this allows for the generation of the reference temperature point without interrupting of the converter.

The individual temperature of a die $D_n$ is determined when the die $D_n$ is not conducting and all the other dies are conducting, i.e. in a ON state.

The multi-die temperature controller 10 provides respectively a current $I_1$ to $I_N$ to each amplifier $110_1$ to $110_N$ that comprise the die temperature sensing means.

The multi-die temperature controller 10 activates the temperature sensing means with the measurement signals $M_1$ to $M_N$.

The multi-die temperature controller 10 provides gate signals $PW_1$ to $PW_N$ to each die $D_1$ to $D_N$.

The multi-die temperature controller 10 receives signals $T_{j,1}$ to $T_{j,N}$ representative of the temperature of each die $D_1$ to $D_N$. The mean of the signals $T_{j,1}$ to $T_{j,N}$ is calculated and provided to an analogue to digital converter comprised in an I/O interface of the multi-die temperature control device.

According to the invention, the multi-die temperature control device controls the temperature of a multi-die power module comprising plural dies, the multi-die temperature control device receives an input signal and drives independently the dies of the multi-die power module. The multi-die temperature control device comprises:

means for obtaining a signal that is representative of the temperature of one die among the dies of the multi-die power module when the die is not conducting, means for obtaining signals that are representative of a reference temperature that is dependent of the temperature of all the dies of the multi-die power module when the dies are not conducting, means for comparing the signal that is representative of the temperature of one die to the signal that is representative of the reference temperature, means for reducing the duration of the conducting time of the die or reducing the duration of the conducting time of the other dies of the multi-die power module according to the comparison result.

Figure 2:
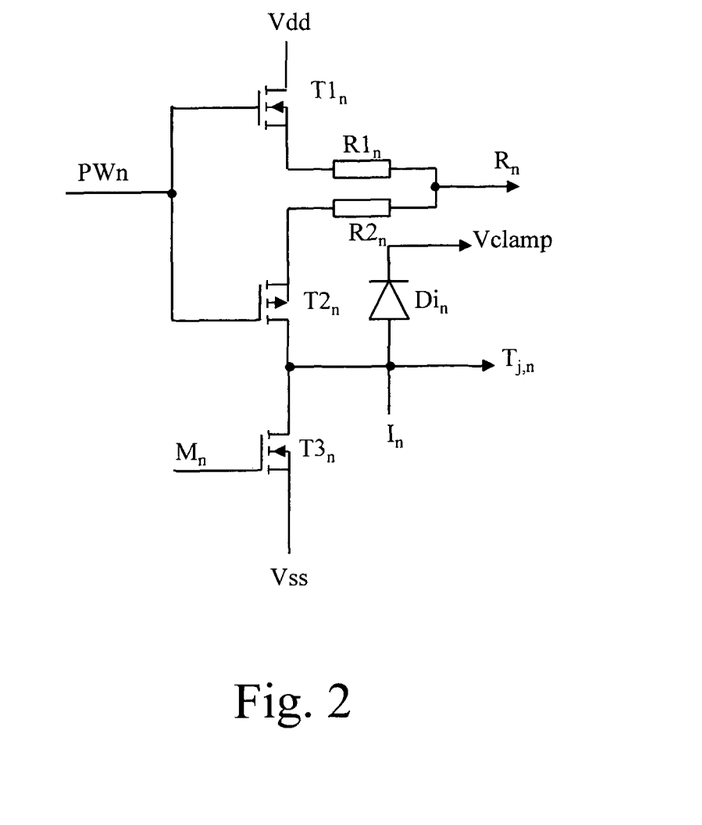
FIG. 2 represents an example of an amplifier including temperature sensing means of a power die according to the present invention.

FIG. 2 represents an example of an amplifier including temperature sensing means of a power die according to the present invention.

The pulse width modulated signal $PW_n$ received by the amplifier including temperature sensing means $110_n$ with n=1 to N is provided to the gates of transistors $T1_n$ and $T2_n$.

The drain of the transistor $T1_n$ is connected to a positive power supply Vdd, the source of the transistor $T1_n$ is connected to a first terminal of a resistor $R1_n$. A second terminal of the resistor $R1_n$ is connected to a first terminal of the internal gate resistor $R_n$.

The source of the transistor $T2_n$ is connected to a first terminal of a resistor $R2_n$. A second terminal of the resistor $R2_n$ is connected to a first terminal of the internal gate resistor $R_n$.

The drain of the transistor $T2_n$ is connected to the drain of a transistor $T3_n$ and to an anode of a diode $Di_n$ and the voltage at that point noted $T_{j,n}$ is dependent of the resistor of the internal gate resistor of the die $D_n$ that varies according to temperature. The source of the transistor $T3_n$ is connected to a negative power supply Vss.

The signal $M_n$ which activates the measurement of the die $D_n$ temperature is provided to the gate of the transistor $T3_n$.

The current $I_n$ provided to the amplifier including temperature sensing means $110_n$ is provided to the anode of the diode $Di_n$.

The cathode of the diode $Di_n$ is connected to a voltage Vclamp, which limits the voltage $T_{j,n}$. The mean of the voltages $T_{j,1}$ to $T_{j,N}$ is provided to the input of the analogue to digital converter that is comprised in the I/O interface of the multi-die temperature controller 10.

Figure 3:
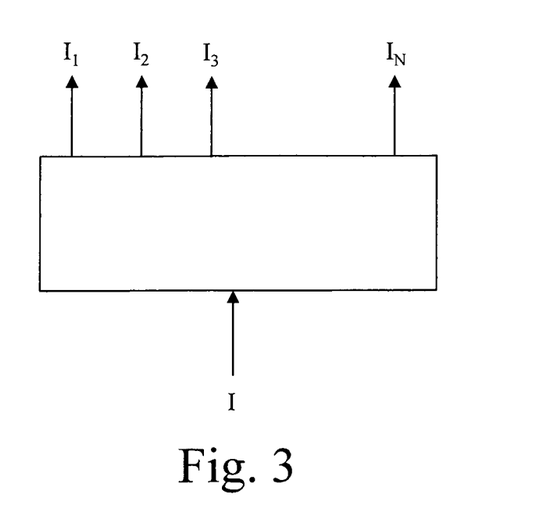
FIG. 3 represents the current dispatching means according to the present invention.

FIG. 3 represents the current dispatching means according to the present invention.

The current dispatching means is comprised in the I/O interface of the multi-die temperature controller 10 that will be disclosed hereinafter.

The current dispatching means provide a current $I_1$ to $I_N$ to the amplifiers including temperature sensing means $110_1$ to $110_N$.

When the temperature of a single die $D_n$ is sensed, the current I is the equal to the current $I_n$ provided to the die $D_n$.

When the reference temperature is sensed, the current I is the equal to the sum of currents $I_1$ to $I_N$ provided to the dies $D_1$ to $D_N$.

Figure 4:
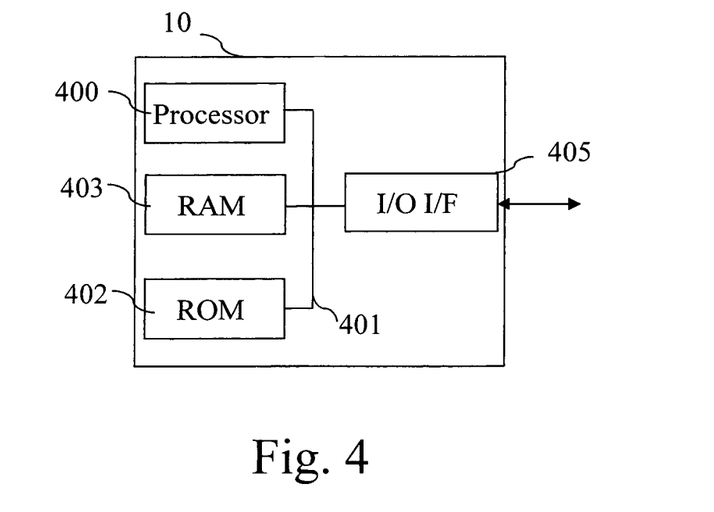
FIG. 4 represents an example of an architecture of a multi-die temperature control device according to the present invention.

FIG. 4 represents an example of an architecture of a multi-die temperature control device according to the present invention.

Figure 6:
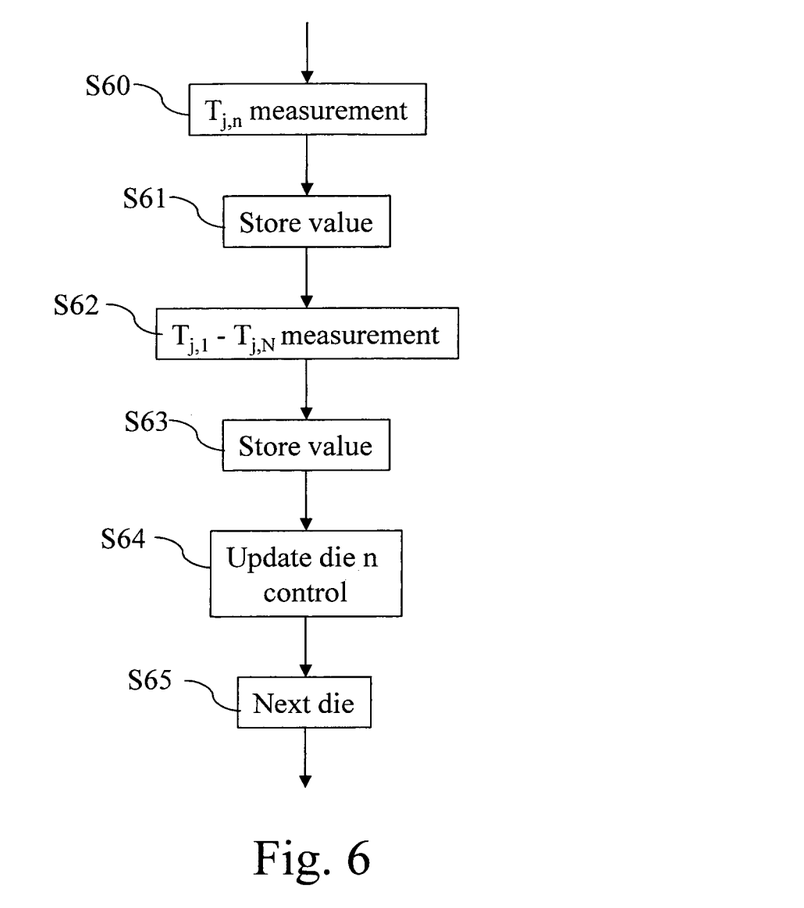
FIG. 6 represents an example of an algorithm for determining the temperature of one die and a reference temperature in order to control the individual dies of the multi-die power module using the reference temperature according to the present invention.

The multi-die temperature control device 10 has, for example, an architecture based on components connected together by a bus 401 and a processor 400 controlled by a program as disclosed in FIG. 6.

The bus 401 links the processor 400 to a read only memory ROM 402, a random access memory RAM 403 and an input output I/O IF interface 405.

The memory 403 contains registers intended to receive variables and the instructions of the program related to the algorithm as disclosed in FIG. 6.

The processor 400 receives through the input output I/O IF 405 measurement of the junction temperatures $T_{j,1}$ to $T_{j,N}$ of the dies $D_1$ to $D_6$, an input signal IN and outputs the pulse width modulated signals $PW_1$ to $PW_N$, the measurement signal $M_1$ to $M_n$ and the current $I_1$ to $I_N$.

The read-only memory, or possibly a Flash memory 402, contains instructions of the program related to the algorithm as disclosed in FIG. 6, which are transferred, when the multi-die temperature control device 10 is powered on, to the random access memory 403.

The multi-die temperature control device 10 may be implemented in software by execution of a set of instructions or program by a programmable computing machine, such as a PC (Personal Computer), a DSP (Digital Signal Processor) or a microcontroller; or else implemented in hardware by a machine or a dedicated component, such as an FPGA (Field-Programmable Gate Array) or an ASIC (Application-Specific Integrated Circuit).

In other words, the multi-die temperature control device 10 includes circuitry, or a device including circuitry, enabling the multi-die temperature control device 10 to perform the program related to the algorithm as disclosed in FIG. 6.

Figure 5:
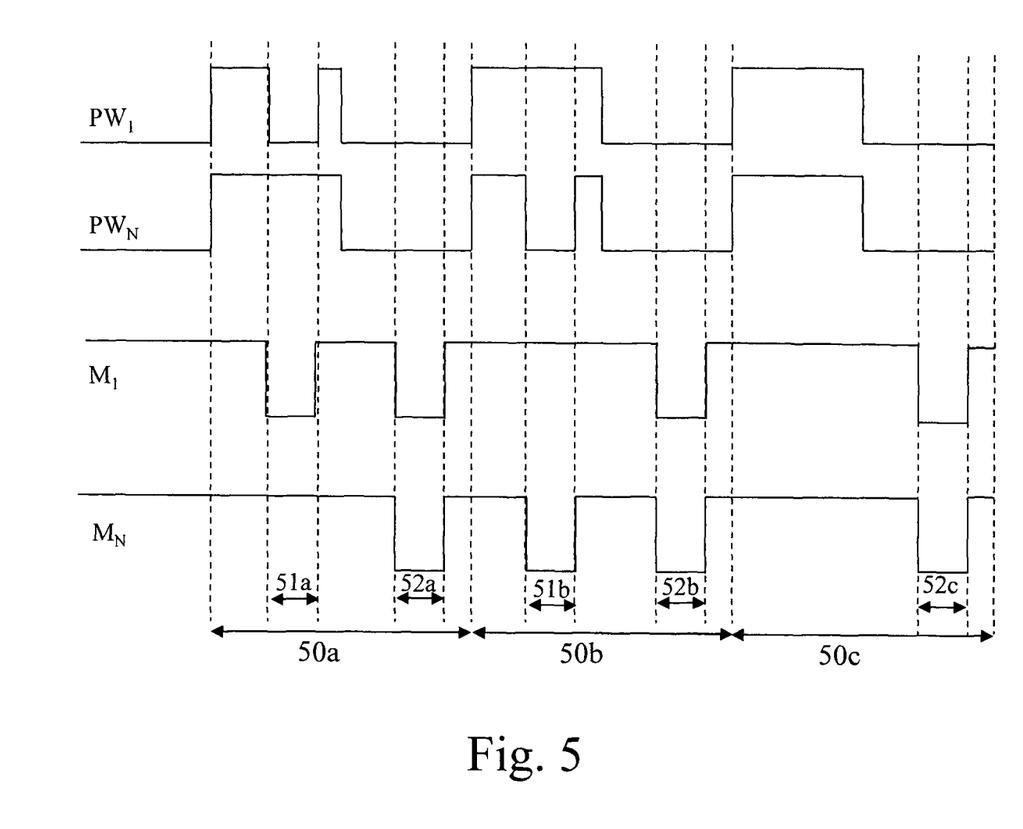
FIG. 5 represents an example of chronograms used for determining the temperature of one die together with a reference temperature of the multi-die power module according to the present invention.

FIG. 5 represents an example of chronograms used for determining the temperature of one die together with the reference temperature of the multi-die power module according to the present invention.

FIG. 5 represents the pulse width modulated signals $P_{W1}$ and $P_{WN}$, and the measurement signals $M_1$ and $M_N$ transferred by the multi-die temperature controller 10 to the amplifiers including temperature sensing means $110_1$ and $110_N$.

According to the present invention, within one cycle 50, the multi-die temperature controller 10 commands one amplifier including temperature sensing means $110_n$ by providing a measurement signal $M_n$ during a time period 51 in order to measure the internal gate resistor $R_n$ value that is dependent of the temperature of the die $D_n$. At the same time, the multi-die temperature controller 10 provides a pulse width modulated signal $PW_n$ to the amplifier including temperature sensing means $110_n$ that puts the die $D_n$ in a non conducting state during the time period 51 whereas all the other dies are in a conducting state.

Within the same cycle 50, the multi-die temperature controller 10 commands all the amplifiers including temperature sensing means $110_1$ to $110_N$ by providing a measurement signal $M_1$ to $M_N$ during a time period 52 in order to measure the equivalent resistor value of the internal gate resistor values $R_1$ to $R_N$ put in parallel that are dependent of the temperature of the dies $D_1$ to $D_N$. At least during the same time period 52, the multi-die temperature controller 10 provides a pulse width modulated signal $PW_1$ to $PW_N$ to the amplifiers including temperature sensing means $110_1$ to $110_N$ that puts the dies $D_1$ to $D_N$ in a non conducting state at least during the time period 52.

Within the cycle 50a, the multi-die temperature controller 10 commands one amplifier including temperature sensing means $110_1$ by providing a measurement signal $M_1$ during the time period 51a in order to measure the internal gate resistor $R_1$ value that is dependent of the temperature of the die $D_1$. At the same time, the multi-die temperature controller 10 provides a pulse width modulated signal $PW_1$ to the amplifier including temperature sensing means $110_1$ that puts the die $D_1$ in a non conducting state during the time period 51a whereas all the other dies $D_2$ to $D_N$ are in a conducting state.

Within the cycle 50a, the multi-die temperature controller 10 commands all the amplifiers including temperature sensing means $110_1$ to $110_N$ by providing a measurement signal $M_1$ to $M_N$ during a time period 52a in order to measure the equivalent resistor value of the internal gate resistor values $R_1$ to $R_N$ put in parallel that are dependent of the temperature of the dies $D_1$ to $D_N$. At least during the same time period 52a, the multi-die temperature controller 10 provides a pulse width modulated signal $PW_1$ to $PW_N$ to the amplifiers including temperature sensing means $110_1$ to $110_N$ that put the dies $D_1$ to $D_N$ in a non conducting state at least during the time period 52a.

Within the cycle 50b, the multi-die temperature controller 10 commands one amplifier including temperature sensing means $110_N$ by providing a measurement signal $M_N$ during the time period 51b in order to measure the internal gate resistor $R_N$ value that is dependent of the temperature of the die $D_N$. At the same time, the multi-die temperature controller 10 provides a pulse width modulated signal $PW_N$ to the amplifier including temperature sensing means $110_N$ that puts the die $D_N$ in a non conducting state during the time period 51b whereas all the other dies $D_1$ to $D_{N-1}$ are in a conducting state.

Within the cycle 50b, the multi-die temperature controller 10 commands all the amplifiers including temperature sensing means $110_1$ to $110_N$ by providing a measurement signal $M_1$ to $M_N$ during a time period 52b in order to measure the equivalent resistor value of the internal gate resistor values $R_1$ to $R_N$ put in parallel that are dependent of the temperature of the dies $D_1$ to $D_N$. At least during the same time period 52b, the multi-die temperature controller 10 provides a pulse width modulated signal $PW_1$ to $PW_N$ to the amplifiers including temperature sensing means $110_1$ to $110_N$ that put the dies $D_1$ to $D_N$ in a non conducting state at least during the time period 52b.

Within the cycle 50c, the multi-die temperature controller 10 commands one amplifier including temperature sensing means $110_n$ by providing a measurement signal $M_n$ during the time period 51c in order to measure the internal gate resistor $R_n$ value that is dependent of the temperature of the die $D_n$. At the same time, the multi-die temperature controller 10 provides a pulse width modulated signal $PW_n$ to the amplifier including temperature sensing means $110_n$ that puts the die $D_n$ in a non conducting state whereas all the other dies are in a conducting state.

Within the cycle 50c, the multi-die temperature controller 10 commands all the amplifiers including temperature sensing means $110_1$ to $110_N$ by providing a measurement signal $M_1$ to $M_N$ during a time period 52c in order to measure the equivalent resistor value of the internal gate resistor values $R_1$ to $R_N$ put in parallel that are dependent of the temperature of the dies $D_1$ to $D_N$. At least during the same time period 52c, the multi-die temperature controller 10 provides a pulse width modulated signal $PW_1$ to $PW_N$ to the amplifiers including temperature sensing means $110_1$ to $110_N$ that put the dies $D_1$ to $D_N$ in a non conducting state at least during the time period 52c.

FIG. 6 represents an example of an algorithm for determining the temperature of one die and a reference temperature in order to control the individual dies of the multi-die power module using the reference temperature according to the present invention.

The present algorithm will be disclosed in an example wherein it is executed by the processor 400 of the multi-die temperature controller 10.

At step S60, the processor 400 commands the generation of a measurement signal command the I/O interface 405 in order to perform a measurement of the internal gate resistor value that is dependent of the temperature of the die $D_n$.

The processor 400 commands the I/O interface 405 in order to transfer a pulse width modulated signal $PW_n$ that is at low level at least during the time period 51 and commands the I/O interface 405 in order to transfer a measurement signal $PW_n$ that enables the current $I_n$ to flow through the internal gate resistor of the die $D_n$ whereas all the other dies are in a conducting state.

The processor 400 commands an analogue to digital converter comprised in the I/O interface 405 in order to sample the voltage value $T_{j,n}$ after a time period which is for example equal to the half of the duration of the time period 51.

At next step S61, the processor 400 memorizes the sampled voltage into the memory 403.

At next step S62, the processor 400 commands the generation of a measurement signals command the I/O interface 405 in order to perform a measurement of the reference temperature that is representative of the equivalent resistor value of the internal gate resistor values put in parallel that is dependent of the temperatures of the dies $D_n$ to $D_n$.

The multi-die temperature controller 10 commands all the amplifiers including temperature sensing means $110_1$ to $110_N$ by providing a measurement signal $M_1$ to $M_N$ during a time period 52 in order to measure the equivalent resistor value of the internal gate resistor values $R_1$ to $R_N$ put in parallel that is dependent of the temperature of the dies $D_1$ to $D_N$. At least during the same time period 52, the multi-die temperature controller 10 commands the I/O interface in order to provide a pulse width modulated signal $PW_1$ to $PW_N$ to the amplifiers including temperature sensing means $110_1$ to $110_N$ that puts the dies $D_1$ to $D_N$ in a non conducting state at least during the time period 52.

The processor 400 commands the analogue to digital converter comprised in the I/O interface 405 in order to sample the average value of the voltage values $T_{j,1}$ to $T_{j,N}$ after a time period which is for example equal to the half of the duration of the time period 52.

At next step S63, the processor 400 memorizes the sampled average voltage value into the memory 403.

At next step S64, the processor 400 updates the pulse width modulated signal $PW_n$ signal to be provided to the die $D_n$ by comparing the values stored at steps S61 and S63.

For example, if the value $T_{j,n}$ is higher than the reference value, the processor 400 reduces the duration of the conducting time of the die $D_n$ during at least one pulse width modulated cycle.

For example, if the value $T_{j,n}$ is lower than the reference value, the processor 400 decreases the duration of the conducting time of the dies $D_1$ to $D_{n-1}$ and $D_{n+1}$ to $D_N$ during at least 1 pulse width modulated cycle.

At next step S65, the processor 400 selects another die that is different from the die $D_n$ and returns to step S60.

Naturally, many modifications can be made to the embodiments of the invention described above without departing from the scope of the present invention.

The invention claimed is:

1. A method for controlling temperature of a multi-die power module comprising plural dies, a multi-die temperature control device receiving an input signal and driving independently the dies of the multi-die power module, wherein the method is executed by the multi-die temperature control device and comprises the steps of:
    obtaining, within one cycle, a signal that is representative of the temperature of one die among the dies of the multi-die power module when the die is not conducting,
    obtaining, within one period of time of the same cycle, signals that are representative of the equivalent resistor value of the internal gate resistors of all the dies in parallel in order to set a reference temperature that is dependent of the temperature of all the dies of the multi-die power module when the dies are not conducting,
    comparing the signal that is representative of the temperature of one die to the signal that is representative of the reference temperature,
    reducing the duration of the conducting time of the die or reducing the duration of the conducting time of the other dies of the multi-die power module according to the comparison result.

2. The method according to claim 1, wherein the signal that is representative of the temperature of one die and the signal that is representative of the reference temperature are obtained by providing a current to the gate of the die and to the gates of the dies.

3. A multi-die temperature control device that controls temperature of a multi-die power module including plural dies, the multi-die temperature control device receiving an input signal and driving independently the dies of the multi-die power module, the multi-die temperature control device comprising:
    means for obtaining within one cycle, a signal that is representative of the temperature of one die among the dies of the multi-die power module when the die is not conducting,
    means for obtaining within one period of time of the same cycle, signals that are representative of the equivalent resistor value of the internal gate resistors of all the dies in parallel in order to set a reference temperature that is dependent of the temperature of all the dies of the multi-die power module when the dies are not conducting,
    means for comparing the signal that is representative of the temperature of one die to the signal that is representative of the reference temperature,
    means for reducing the duration of the conducting time of the die or reducing the duration of the conducting time of the other dies of the multi-die power module according to the comparison result.

4. The multi-die temperature control device according to claim 3, wherein the signal that is representative of the temperature of one die and the signal that is representative of the reference temperature are obtained by providing a current to the gate of the die and to the gates of the dies.

\* \* \* \* \*